(12) United States Patent
Boardman et al.

(10) Patent No.: US 11,133,438 B2
(45) Date of Patent: Sep. 28, 2021

(54) LIGHT-EMITTING DEVICE WITH TRANSPARENT NANOPARTICLE ELECTRODE

(71) Applicant: Sharp Kabushiki Kaisha, Osaka (JP)

(72) Inventors: Edward Andrew Boardman, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 20 days.

(21) Appl. No.: 16/689,383

(22) Filed: Nov. 20, 2019

(65) Prior Publication Data

US 2021/0151629 A1    May 20, 2021

(51) Int. Cl.
*H01L 33/38* (2010.01)
*H01L 33/52* (2010.01)
*H01L 33/50* (2010.01)
*H01L 33/40* (2010.01)
*H01L 33/06* (2010.01)

(52) U.S. Cl.
CPC ............ *H01L 33/387* (2013.01); *H01L 33/06* (2013.01); *H01L 33/40* (2013.01); *H01L 33/502* (2013.01); *H01L 33/52* (2013.01)

(58) Field of Classification Search
None
See application file for complete search history.

(56) References Cited

U.S. PATENT DOCUMENTS

| | | |
|---|---|---|
| 7,304,428 B2 | 12/2007 | Ghosh et al. |
| 8,633,474 B2 | 1/2014 | de la Vega et al. |
| 9,419,174 B2 | 8/2016 | Zheng et al. |
| 10,600,980 B1 * | 3/2020 | Boardman .......... H01L 51/5206 |
| 2007/0045619 A1 * | 3/2007 | Park ...................... C08G 77/50 257/40 |
| 2007/0068569 A1 | 3/2007 | Nam et al. |

(Continued)

OTHER PUBLICATIONS

Weigao Wang et al.: "Highly transparent quantum-dot light-emitting diodes with sputtered indium-tin-oxide electrodes", DOI: 10.1039/c5tc04223b, J. Mater. Chem. C, 2016, 4, 1838.

*Primary Examiner* — Zandra V Smith
*Assistant Examiner* — Lawrence C Tynes, Jr.
(74) *Attorney, Agent, or Firm* — Renner, Otto, Boisselle & Sklar, LLP

(57) ABSTRACT

A light-emitting device incorporates an electrode that includes conductive nanoparticles to increase emission performance. A light-emitting device includes a substrate; a first electrode disposed on the substrate between a viewing side of the light-emitting device and the substrate; a second electrode disposed between the first electrode and the viewing side of the light-emitting device, wherein the second electrode includes a layer of nanoparticles that are electrically conductive; and an emissive layer comprising quantum nanoparticles in electrical contact with the first electrode and the second electrode, wherein the first emissive layer includes a material that emits light when electrically excited. Multiple light-emitting devices may constitute sub-pixels that are combined into a pixel, such as for a display device, wherein each sub-pixel emits light of a different color. Thicknesses of the charge transport layers are the same for the sub-pixels, and/or emissive layer portions of the different sub-pixels have different thicknesses.

18 Claims, 8 Drawing Sheets

(56) References Cited

U.S. PATENT DOCUMENTS

2008/0001538 A1* 1/2008 Cok ........................ B82Y 20/00
                                                                                         313/506
2016/0359130 A1* 12/2016 Wehlus ............... H01L 51/5268
2019/0305246 A1* 10/2019 Helander ................ H01L 51/52

* cited by examiner

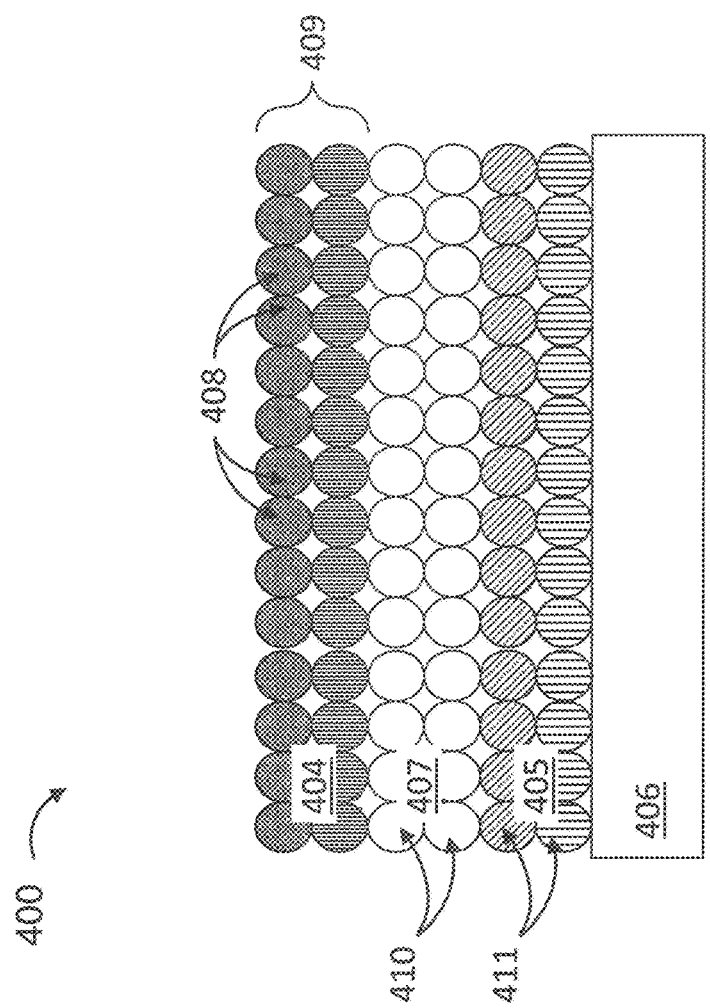

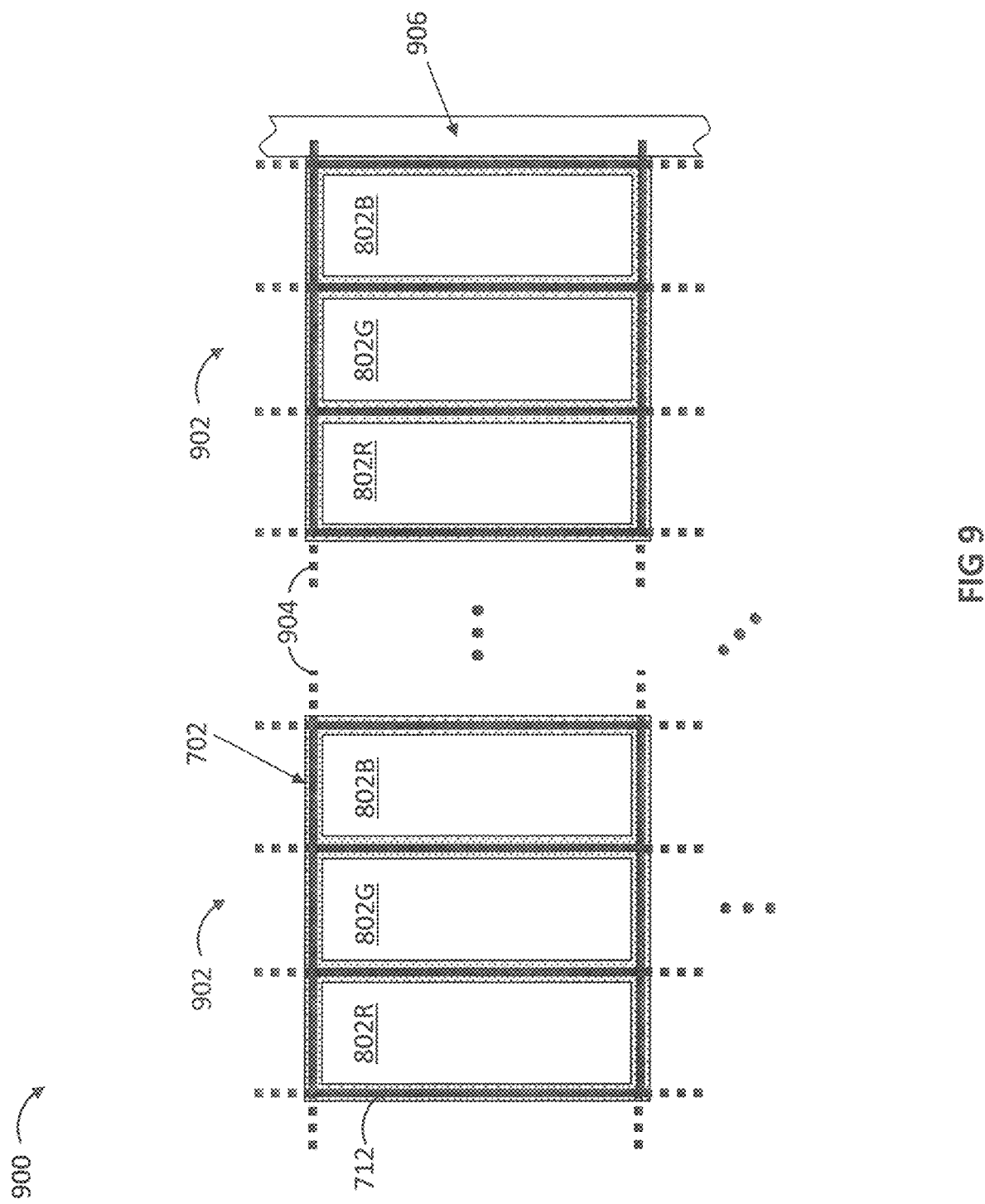

LIGHT-EMITTING DEVICE WITH TRANSPARENT NANOPARTICLE ELECTRODE

TECHNICAL FIELD

The present invention relates to a light-emitting device and, more specifically, to a structure for a light-emitting device that uses transparent nanoparticles as an electrode material.

BACKGROUND ART

Conventional light-emitting devices include a substrate, two electrodes (an anode and a cathode), an emissive layer (EML), a first charge transport layer between the anode and the EML, and a second charge transport layer between the cathode and the EML. The EML contains a material that emits light upon electron and hole recombination. The electrode material through which light is emitted must be both a good electrical conductor to conduct charges to the EML and at least partially transparent to allow transmission of light out of the light-emitting device. A desirable electrode material has an optical transmission that is as high as possible in the visible spectrum (i.e., wavelengths of 400 nm to 700 nm) and a resistivity which is as low as possible. An ideal material with 100% optical transmission and zero resistivity, however, is not known, and conventional approaches to enhance such parameters increase device thickness or manufacturing complexity to obtain acceptable optical and electrical performance.

A common choice of electrode is a thin silver layer or a thin magnesium silver alloy layer, examples of which may be found in U.S. Pat. No. 7,304,428 (Ghosh et al., issued Dec. 4, 2007) and U.S. Pat. No. 9,419,174 (Zheng et al., issued Aug. 16, 2016). The use of silver results in the electrode having low resistivity. However, the minimum thickness of the silver layer is limited by "islanding," in which discrete domains of material are formed rather than a single continuous layer. Islanding greatly increases the difficulty of obtaining a layer that is less than 10 nm thick. At this thickness, pure silver reflects more than 50% of red light with a wavelength of 630 nm. The inclusion of magnesium beneficially alters the work function of the electrode and improves the wetting of the layer during deposition, reducing islanding. However, magnesium also reduces the conductivity of the electrode, meaning a thicker electrode must be used to achieve good electrical performance. This results in a silver alloy electrode with reflectivity similar to a pure silver electrode.

The reflection of light by an electrode results in a microcavity being formed between the electrode through which light is emitted and a second, reflecting electrode. The microcavity adds complexity to the design and manufacturing of light-emitting devices used in a display because the cavity length must be optimized for each different color of light separately. For example, to achieve efficient red, green, and blue sub-pixels, the thickness of one or more of the layers must be different depending on the color of the sub-pixel. The tolerance for these thicknesses may be tight, with an incorrect thickness leading to decreased light extraction and/or a variation in color of the sub-pixel as a function of viewing angle, neither of which is desirable in a display application. Accordingly, improved light-emitting devices that rely less on a microcavity to improve transmission are desirable.

Conventional alternatives to using a silver electrode include transparent conductive oxides that are known for having high transparency in the visible spectrum while still having high conductivity. Examples include indium tin oxide (ITO), indium zinc oxide (IZO) and indium gallium zinc oxide (IGZO). Layers of these materials are typically deposited by sputter coating. This is a high energy process which has previously been found to damage organic materials used in organic light-emitting devices (OLEDs). Wang et al. (J. Mater. Chem. C, 2016, 4, 1838) improves light-emitting devices with an ITO layer sputter coated in a quantum dot LED (QLED). Wang et al. increases the thickness of the electron transport layer (ETL) so that an ITO layer could be deposited with less damage to the emissive layer. However, a thicker ETL has a disadvantage of increasing operating voltage, which reduces overall device efficiency.

Nanoparticles of a conductive oxide, such as $TiO_2$ or ZnO, or metal may be deposited by solution-processable techniques as found in the related field of photovoltaics, for example in US 2007/0068569 (Nam et al., published Mar. 29, 2007) and U.S. Pat. No. 8,633,474 (de la Vega et al., issued Jan. 21, 2014) respectively. However, to achieve high conductivity after solution processing, a high temperature annealing step is required, usually including heating the device to approximately 450° C. Such high temperatures are incompatible with the materials used in an OLED or QLED, and therefore such techniques cannot be used in this field.

SUMMARY OF INVENTION

There is a need in the art for systems and methods for an improved electrode layer characterized by high optical transmission and low resistivity. The present invention relates to an organic light-emitting device (OLED) and/or a quantum dot light-emitting device (QLED) that uses transparent nanoparticles as an electrode material to increase the optical transparency of the electrode. The improved transparency of the electrode layer decreases the enhancement required from an optical cavity while maintaining a high optical extraction efficiency. The decreased enhancement required from of the optical cavity relaxes manufacturing tolerances and enables a wider range of charge transport layer (CTL) and emissive layer (EML) thicknesses to be used. Additionally, the decreased enhancement required from the optical cavity reduces design and manufacturing complexity by enabling CTLs to be the same thickness for any wavelength of EML, such as for use in sub-pixels that emit different colors, while obtaining a distribution of light that does not exhibit a change in color with viewing angle.

An aspect of the invention, therefore, is a light-emitting device that incorporates an electrode that includes conductive nanoparticles to increase emission performance. In exemplary embodiments, a light-emitting device includes a substrate; a first electrode disposed on the substrate between a viewing side of the light-emitting device and the substrate; a second electrode disposed between the first electrode and the viewing side of the light-emitting device, wherein the second electrode includes a layer of nanoparticles that are electrically conductive; and an emissive layer comprising quantum nanoparticles in electrical contact with the first electrode and the second electrode, wherein the first emissive layer includes a material that emits light when electrically excited. Multiple light-emitting devices may constitute sub-pixels that are combined into a pixel, such as for a display device, wherein each sub-pixel emits light of a different color. A pixel, for example, may include red, green, and blue sub-pixels. In exemplary embodiments, thicknesses of the charge transport layers are the same for the sub-pixels, and/or emissive layer portions of the different sub-pixels have different thicknesses.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 4 is schematic drawing depicting a top electrode of a quantum dot LED in accordance with embodiments of the present invention.

FIG. 9 is a plan view depicting how blocks of three quantum dot LEDs with the conductive grid shown in FIG. 8 are tiled to make a display device in accordance with embodiments of the present invention.

DESCRIPTION OF EMBODIMENTS

Figure 1:
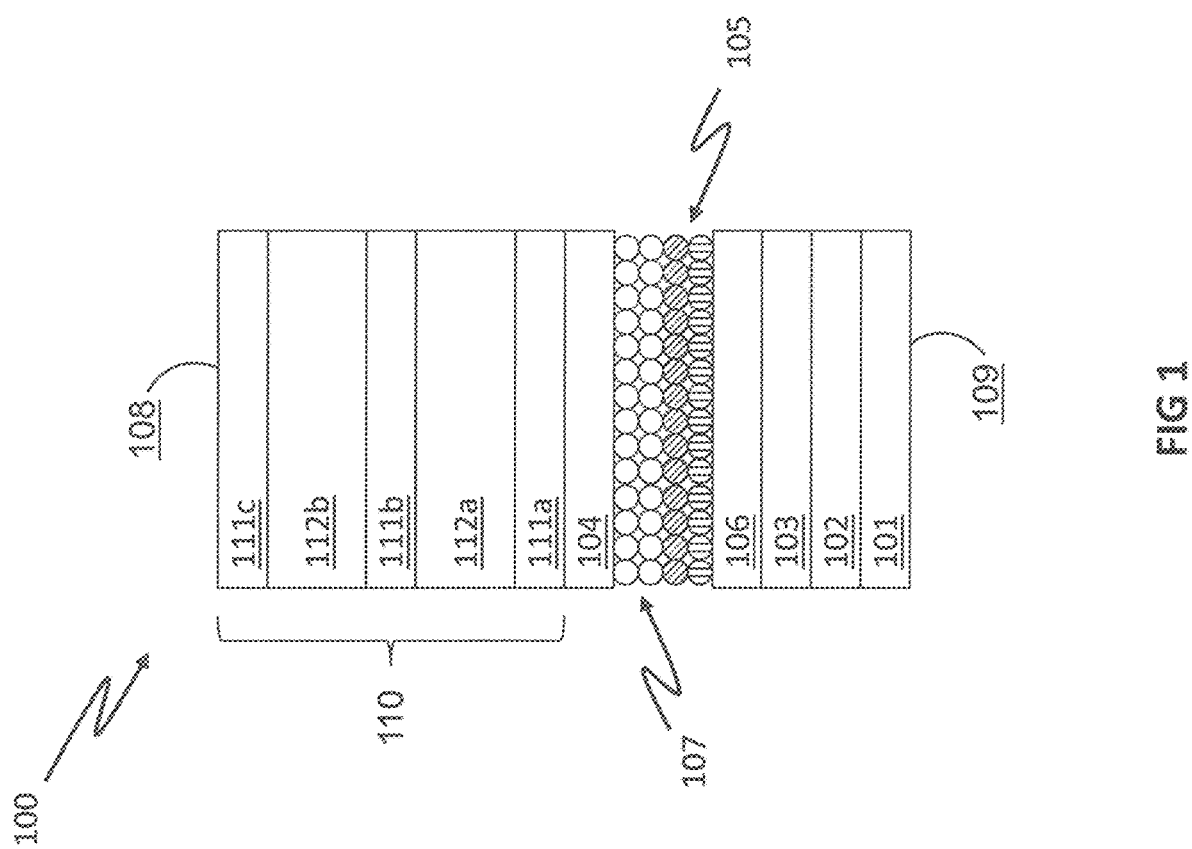
FIG. 1 is a schematic drawing depicting a cross-sectional view of a conventional top-emitting light-emitting device (LED) structure.

Embodiments of the present invention will now be described with reference to the drawings, wherein like reference numerals are used to refer to like elements throughout. It will be understood that the figures are not necessarily to scale.

Conventional LED

Advantages and enhancements of the present application are understood by comparison to a conventional light-emitting device (LED) structure. FIG. 1 is a schematic drawing depicting a cross-sectional view of a conventional top-emitting LED structure 100. An LED structure 100 is formed with an emissive layer (EML) 105 containing a material that emits light upon electron and hole recombination. The EML 105 may include an organic material, and with an organic EML the LED structure 100 may be referred to as an organic LED (OLED). The EML 105 may include semiconductor quantum dots (QDs), and with a quantum dot EML the LED structure 100 may be referred to as a quantum dot LED (QD-LED, QLED or ELQLED). As compared with OLED display devices, QLED display devices are operable at higher current densities such that the luminance of the device is higher and emit light that covers a narrower range of wavelengths which produces more saturated colors. Another advantage of using QLEDs may include the devices being more readily solution-processable such that expensive vacuum systems are not required during processing.

The typical top-emitting LED structure 100 may include a stack of planar layers disposed on a substrate 101, with the layers including: a reflector 102, two electrodes including an anode 103 and a cathode 104, an emissive layer (EML) 105, one or more charge transport layers (CTLs) 106 between the anode 103 and the EML 105, and one or more CTLs 107 between the cathode 104 and the EML 105. The EML 105 may include quantum nanoparticles such as quantum dots and/or quantum rods that emit light when electrons generated by the cathode and holes generated by the anode recombine in the EML 105. In an alternative embodiment, the EML 105 may include an organic material that emits light when electrons and holes recombine in the EML 105. The LED structure has a top surface 108 and a bottom surface 109 associated with the substrate 101. A thin-film encapsulation layer 110 may be applied to the top electrode, cathode 104, to prevent oxygen and moisture ingress into the LED structure 100. The thin-film encapsulation layer 110 may include repeating dyads of an inorganic layer 111 and a polymer layer 112 between the cathode 104 and the top surface 108 (each dyad respectively being denoted as 111a/112a, 111b/112b, and a top inorganic layer 111c). The thin-film encapsulation layer 110 prevents oxygen or moisture from damaging the LED structure 100.

In the LED structure 100, the CTLs 106 between the anode 103 and the EML 105 may include hole transporting layers (HTLs), hole injection layers (HILs), and/or electron blocking layers (EBLs). In the LED structure 100, the CTLs 107 between the cathode 104 and the EML 105 may include electron transporting layers (ETLs), electron injection layers (EILs), and/or hole blocking layers (HBLs). For simplicity, any layer between an electrode (i.e., anode 103 or cathode 104) and the EML 105 may be referred to more generally as a charge transporting layer (CTL). The CTLs in general operate to transport and inject electrons and holes into the emissive layer 105, where the electrons and holes recombine to produce light.

During operation, a voltage bias may be applied between the anode 103 and the cathode 104. The cathode 104 injects electrons into the adjacent CTL 107, and likewise the anode 103 injects holes into the adjacent CTL 106. The electrons and holes propagate through the CTLs to the EML 105, where the electrons and holes radiatively recombine and light is emitted. The emitted light propagates through the CTL 107, through the cathode 104 and through the thin-film encapsulation layer 110 into air, where the light may be seen by a viewer.

The device as described with reference to FIG. 1 may be referred to as a "standard" structure, which is a structure in which the anode 103 is closest to the substrate 101. The positions of the anode 103 and cathode 104 may be interchanged, and the following description may be equally applicable to either structure. A device in which the cathode 104 is closest to the substrate 101 may be referred to as an "inverted" structure.

In LED structure 100, light is emitted into air through the electrode further from the substrate 101 (the "top electrode"), and thus such LED structure is referred to as a "top emitter". A top emitter will have a viewing side associated with the top or outer surface 108 farthest from the substrate of the LED structure 100. In alternative embodiments, the LED structure 100 may be configured to emit light into air through the substrate 101 and be referred to as a "bottom emitter." A bottom emitter will have a viewing side associated with the bottom surface 109 of the substrate 101 of the LED structure 100.

When the LED structure 100 is used as a light-emitting element, such as a pixel in an active matrix display, thin-film transistors (TFTs) are present between the substrate 101 and an electrode of the light-emitting device. These TFTs and associated metal wiring block light and hence reduce the fraction of the light that can be emitted through the substrate 101 when the LED is configured as a bottom emitting device. TFTs and associated metal wiring are generally a fixed size and as the LED structure 100 becomes smaller, such as for smaller pixels in a high-resolution display, the fraction of light lost increases. Therefore, it is desirable to use a top-emitter device because light is not emitted through the substrate 101, and thus the TFTs have no influence on the amount of light that may be extracted from the pixel. In the LED structure 100, the reflector 102 may be formed to cover TFTs disposed on the substrate 101.

Figure 2:
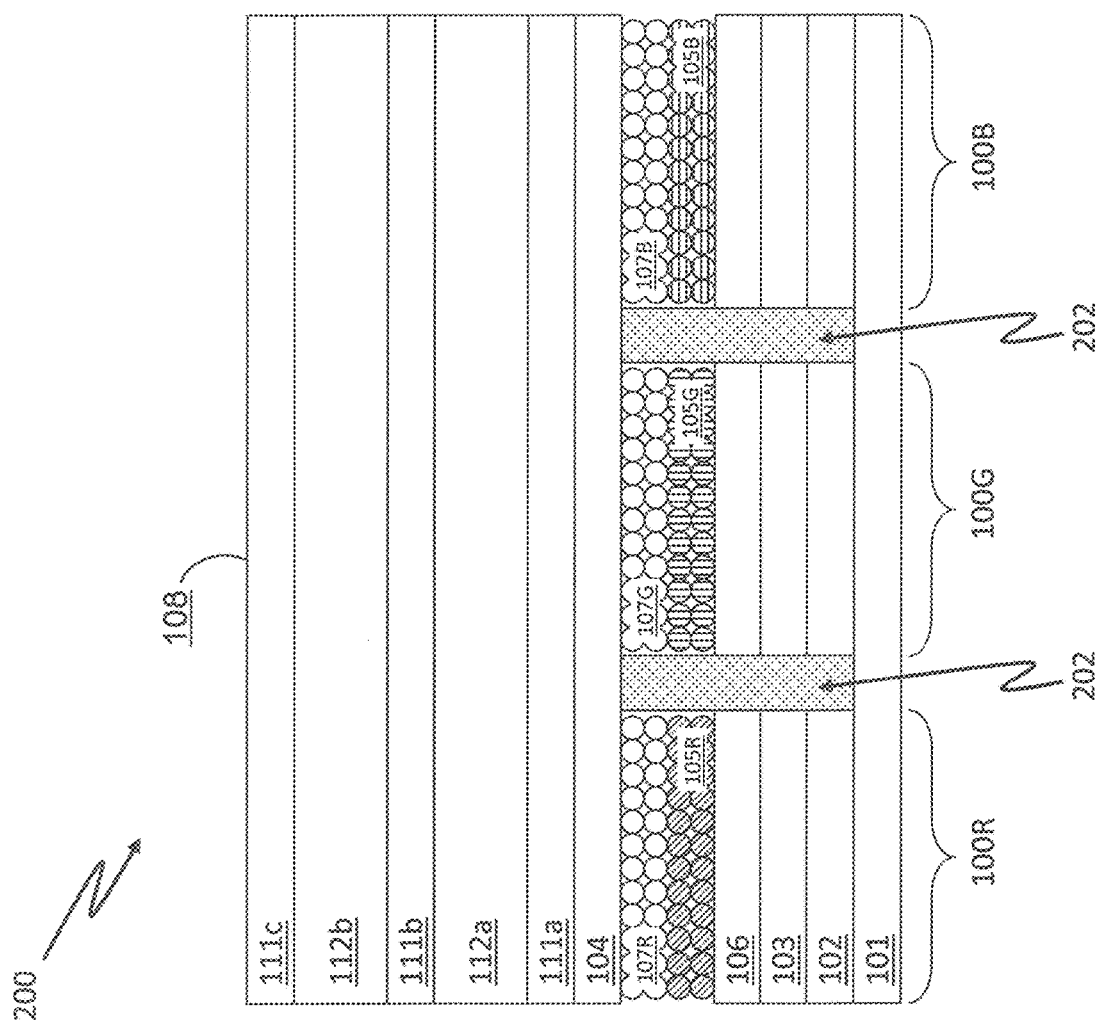
FIG. 2 is a schematic drawing depicting a conventional pixel structure with three top-emitting LEDs as arranged in a pixel for a display device.

FIG. 2 is a schematic drawing depicting a conventional pixel 200 with three top-emitting LEDs as may be arranged in a display device. The conventional pixel 200 may include a red LED structure 100R, a green LED structure 100G, and a blue LED structure 100B. More generally, with reference to the various layers in the figure, "R" denotes the red sub-pixel, "G" denotes the green sub-pixel, and "B" denotes the blue sub-pixel. Each of the LED structures of the conventional pixel 200 shares a common top electrode, e.g., cathode 104, which conducts charges across the conventional pixel 200 to each individual LED structure. The LED structures 100 are formed on the shared substrate 101 and separated by one or more bank structures 202. The emissive layer 105 is different for each of the three light-emitting devices, resulting in each device emitting a different color of light. For example, the red LED structure 100R may be formed with a material that causes the EML 105R to emit red light, the green LED structure 100G may be formed with a material that causes the EML 105G to emit green light, and the blue LED structure 100B may be formed with a material that causes the EML 105B to emit blue light.

Figure 3:
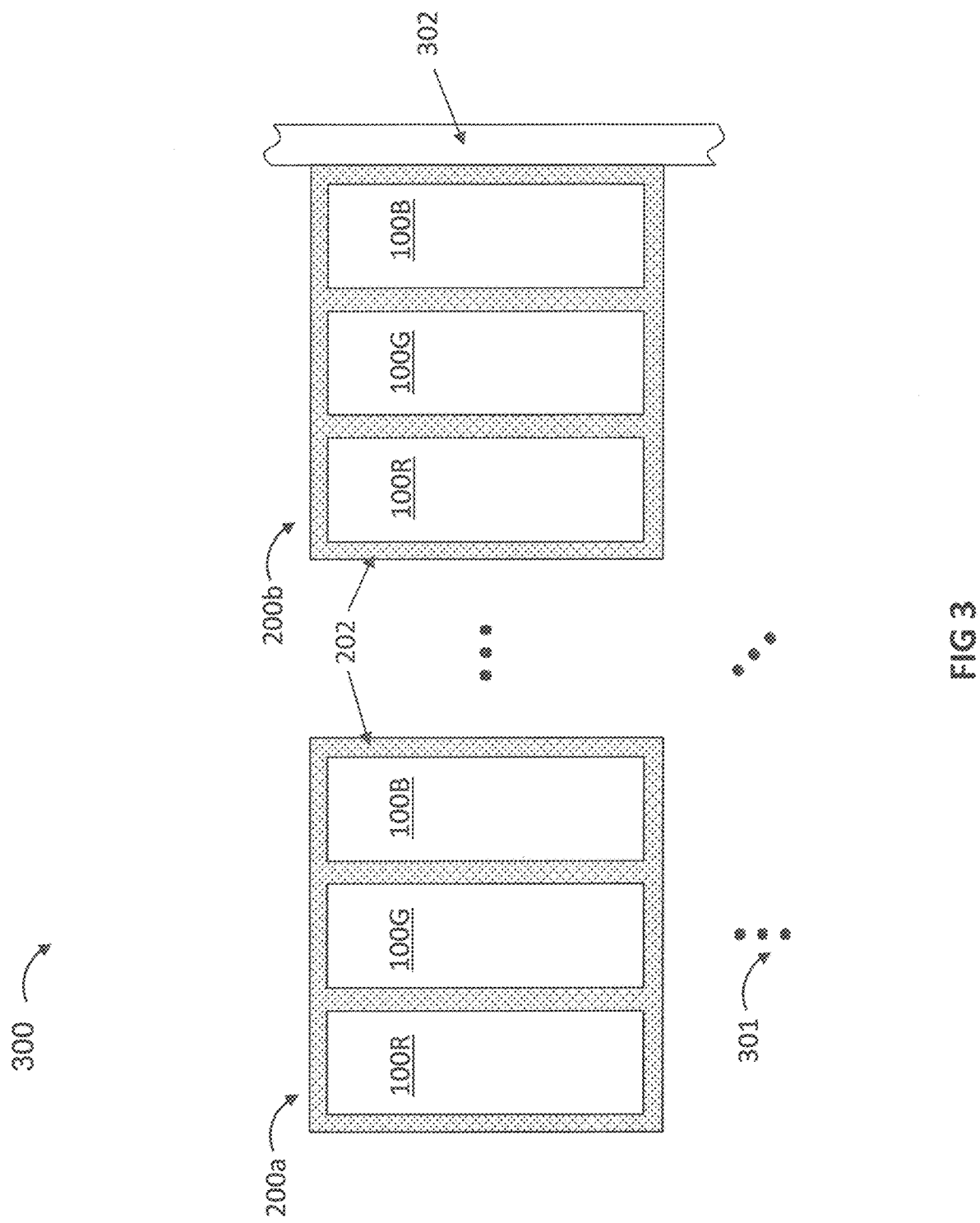
FIG. 3 is a plan view depicting how blocks of three LEDs shown in FIG. 2 are tiled to make a display device.

FIG. 3 is a plan view depicting how pixels including three LEDs as shown in FIG. 2 are tiled to make a display device 300. The display device 300 includes an array of pixels 200 (two pixels 200a and 200b are illustrated as representative) coupled in different directions 301 in a plane. The semi-transparent common electrode, e.g., cathode 104, is in electrical contact with an electrical connection 302 at the edge of the display device 300, which injects charges into the common electrode. The one or more bank structures 202 separate the LED structures 100 in the display device 300.

Nanoparticle Common Electrode LED

An aspect of the invention is an LED, which includes transparent nanoparticles as an electrode material to increase the optical transparency of the electrode and reduce the strength requirements for the optical cavity in the LED. Decreasing the strength of the optical cavity relaxes manufacturing tolerances by enabling a wider range of charge transport and emissive layer thicknesses to be used while maintaining a high optical extraction efficiency. Additionally, reducing the strength of the cavity advantageously reduces design and manufacturing complexity by enabling the same thickness of charge transport layers to be used for any wavelength of emitted light while obtaining a distribution of light that does not exhibit a change in color with viewing angle.

FIG. 4 is schematic drawing depicting a top electrode of a quantum dot LED 400 in accordance with embodiments of the present invention. A QLED 400 may be formed using one or more layers of nanoparticles. To simplify the discussion of the QLED 400, and the QLED structures as illustrated in subsequent figures, additional layers of a QLED structure that are similar to conventional structures are not shown. The QLED 400 includes a top electrode 404, an emissive layer (EML) 405, a hole transport layer (HTL) 406, and an electron transport layer (ETL) 407. The top electrode 404 of the QLED 400 includes one or more layers of nanoparticles 408. The nanoparticles 408 are electrically conductive, preferably associated with a sheet resistance less than 1000 Ω/sq. and more preferably associated with a sheet resistance less than 100 Ω/sq. The nanoparticles 408 are at least semi-transparent to light in the visible wavelength range, preferably with transmission at least 70% for light in the wavelength range 400 nm≤λ≤700 nm, and more preferably with transmission at least 80% for light in the wavelength range 400 nm≤λ≤700 nm. Example materials for the conductive transparent nanoparticles 408 include indium tin oxide (ITO), indium zinc oxide (IZO), indium gallium zinc oxide (IGZO), zinc oxide (ZnO), aluminum zinc oxide (AZO), and titanium dioxide ($TiO_2$).

The nanoparticles 408 may be deposited by solution process techniques, such as spin coating, slot-dye coating, ink-jet printing, or gravure printing. The top electrode 404 layer may undergo mild thermal treatment after deposition. For example, baking on a hot plate or in an oven at 80° C. may be performed to increase conductivity and remove residual solvent in the layer which may remain after solution processing.

The thickness 409 of the top electrode layer 404 including nanoparticles 408 may be between 30 nm and 2000 nm. The thickness 409 of the top electrode layer 404 including nanoparticles 408 may be decreased to advantageously increase the transmission through the top electrode layer 404. The thickness 409 of the top electrode layer 404 including nanoparticles 408 may be increased to advantageously increase the conductivity of the top electrode 404. Additionally, increasing the thickness 409 of the electrode has the benefit of making the QLED 400 more resistant to damage due to ambient oxygen and moisture. The increased thickness 409 of the top electrode layer increases the path length for the molecules to travel before they reach the CTLs 407, 406 and EML 405 of the QLED 400. Increasing the thickness 409 of the top electrode layer 404 reduces the transmission of detrimental molecules from the ambient air into the device layers and may allow one or more dyads of a thin film encapsulation to be removed without affecting device robustness and minimizing the increase in total thickness of the light-emitting device. The QLED 400 may be formed with a single dyad to reduce the number of manufacturing steps and to reduce exposure to high temperature processes.

Additional processing steps may be performed on the top electrode layer 404 including nanoparticles 408 to further improve its performance. For example, the layer may be exposed to high intensity light from a xenon flash lamp in a technique called photonic annealing or photonic sintering. Infra-red and/or ultra-violet light from the flash lamp is absorbed by the nanoparticles 408, causing a rapid and temporary increase in temperature of the top electrode 404 layer including nanoparticles 408. The rapid and temporary increase in temperature improves the conductivity of the top electrode layer 404 without damaging the other layers in the QLED 400, which either do not experience a significant increase in temperature or rapidly cool as the heat is dissipated into the substrate.

The nanoparticles 408 of the top electrode 404 and nanoparticles 410 of the adjacent charge transport layer, ETL 407, may be composed of the same material. When the top electrode 404 and the ETL 407 are composed of the same material, there is no energy barrier to overcome when charges are transferred from the top electrode 404 into the charge transport layer, ETL 407. Accordingly, the operating voltage of the QLED 400 is reduced and the efficiency is increased.

While the light-emitting device of FIG. 4 is described above as a QLED, an organic LED may also be used with the top electrode layer 404 including nanoparticles 408.

Figure 5:
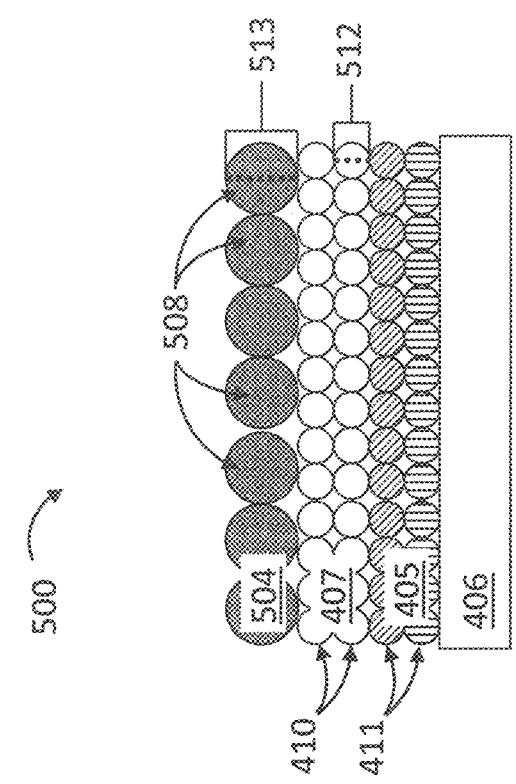
FIG. 5 is a schematic drawing depicting a top electrode comprised of large diameter nanoparticles in accordance with embodiments of the present invention.

FIG. 5 is a schematic drawing depicting an LED structure 500 having a top electrode 504 including large diameter nanoparticles 508 in accordance with embodiments of the present invention. A QLED 500 may include nanoparticles 508 in the top electrode 504 that are characterized by a larger diameter 513 as compared to a smaller diameter 512 of the nanoparticles 410, 411 of the CTL(s), ETL 407, and the EML 405. For example, the diameter 512 of the nanoparticles 410, 411 of the CTL(s), i.e., ETL 407, and the EML 405 may be between 1 nm and 20 nm, whereas the diameter 513 of the large nanoparticles 508 of the top electrode 504 may be between 50 nm and 1000 nm. The use of large nanoparticles 508 in the top electrode 504 reduces the number of individual particles in the layer and improves the conductivity of the top electrode 504 because of a reduction in the number of interfaces between particles per unit length.

Figure 6:
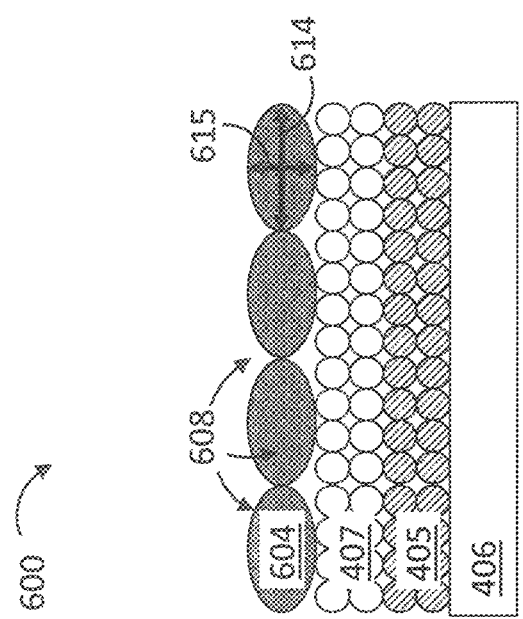
FIG. 6 is a schematic drawing depicting a top electrode comprised of elongated nanoparticles in accordance with embodiments of the present invention.

FIG. 6 is a schematic drawing depicting an LED structure 600 having a top electrode 604 including elongated nanoparticles 608 in accordance with embodiments of the present invention. The nanoparticles 608 of a top electrode 604 in an QLED 600 need not be spherical in shape. The nanoparticles 608 may be elongated along a single major axis 614 ("nanorods"), or elongated along two orthogonal major axes ("nanoplatelets"), relative to a minor axis 615. During deposition, the nanoparticles 608 will tend to arrange themselves with the minor axis 615 normal to the plane of the layer. This alignment is advantageous because the conductivity of the top electrode 604 electrode is enhanced in the plane of the top electrode due to the reduced number of interfaces between nanoparticles 608. Furthermore, the primary purpose of the top electrode 604 is to conduct charges in the plane of the top electrode 604 to the charge transport layer, ETL 407, which is vertically aligned with the EML 405, and therefore this improves the charge transport through the QLED 600. By increasing the conductivity of the top electrode 604, the thickness of the top electrode layer 604 may be decreased, which increases the optical transparency of the electrode.

Figure 7:
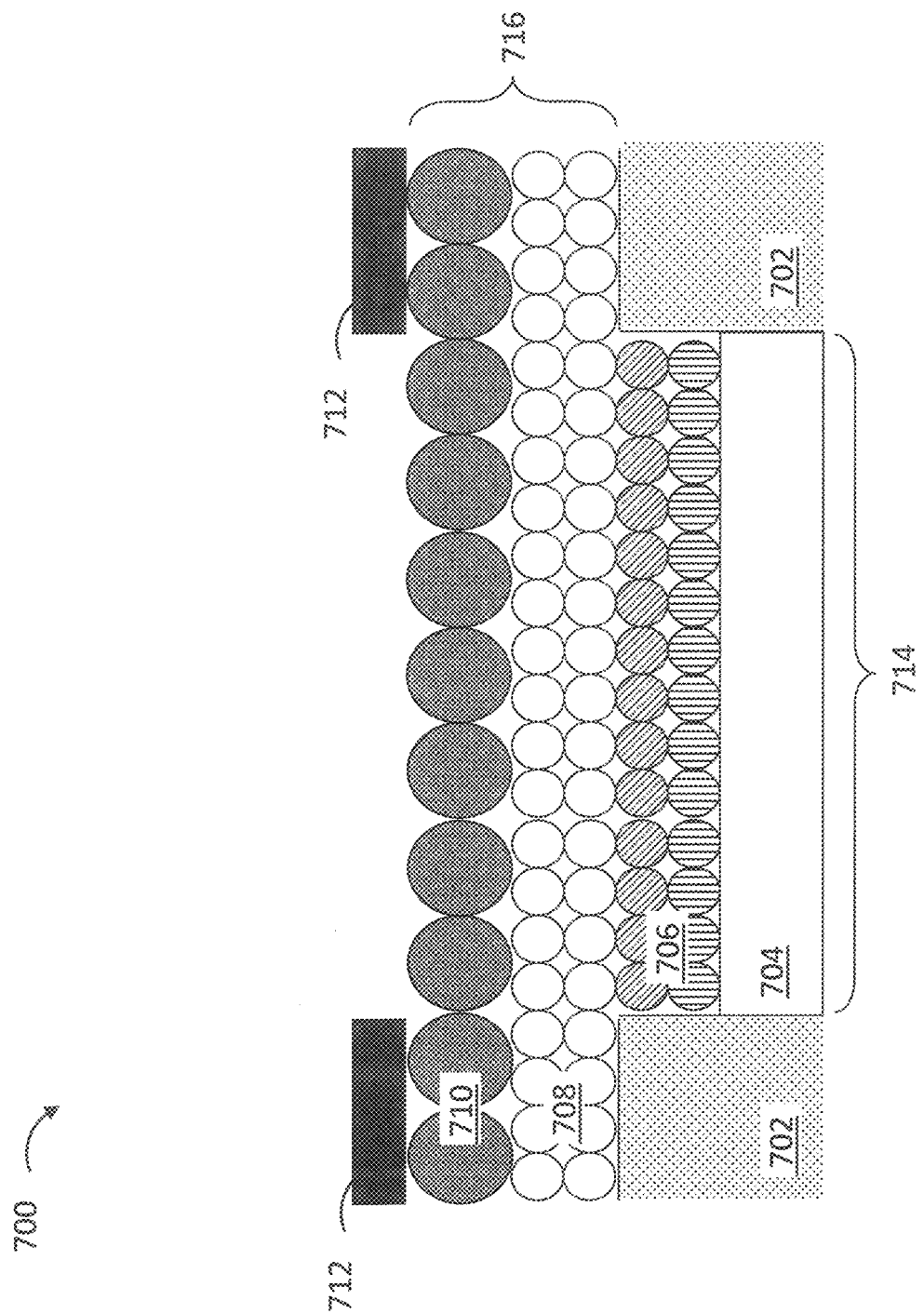
FIG. 7 is a schematic drawing depicting a sub-pixel structure with a conductive grid coupled to a nanoparticle electrode in accordance with embodiments of the present invention.

FIG. 7 is a schematic drawing depicting a sub-pixel structure 700 with a conductive grid coupled to a nanoparticle electrode in accordance with embodiments of the present invention. The sub-pixel structure 700 may be part of a larger pixel array in a display device. The sub-pixel structure 700 includes one or more bank structures 702, a first CTL 704, an EML 706, a second CTL 708, a nanoparticle top electrode 710, and a conductive grid 712. The use of the conductive grid 712 improves the electrical performance of the electrode 710. The conductive grid 712 may be made of a metal, for example aluminum, copper, or silver. The conductive grid 712 may be deposited using standard photolithography patterning and metal evaporation techniques. The conductive grid 712 may be semi-transparent or opaque. Preferably the conductive grid 712 is semi-transparent to improve off-axis optical transmission and reduce ambient light reflection. Reduced ambient reflections results in less light from a pixel in the off state being seen by an observer, increasing the contrast ratio of the display device, and improving image quality. Suitable thicknesses for the conductive grid 712 are in the range 10 nm to 200 nm.

By disposing the conductive grid 712 so that the gird structure is vertically over the one or more bank structures 702, light emitted from the EML 706 of the sub-pixel structure 700 is not significantly occluded by the conductive grid 712. This advantageously retains the high optical transmission of the sub-pixel structure 700 achieved by using the nanoparticle top electrode 710 to spread the charges over the complete surface of a pixel. Furthermore, depending on the application of a display device, the width 714 of the EML 706 in a sub-pixel of a display device may be in the range 5 microns to 100 microns. The vertical displacement 716 between the conductive grid 712 and the EML 706 is at maximum the thickness of the nanoparticle top electrode 710 and the intervening charge transport layers 708, which corresponds to a thickness of approximately 2 microns. Therefore, the close vertical proximity of the conductive grid as compared to the width of the area of the pixel which emits light (from 2.5 times wider to 50 times wider than the vertical displacement) results in only a small fraction of the light emitted from the pixel being occluded when the display device is viewed at a high viewing angle. This ensures that the display device retains a high luminance when viewed at high viewing angles i.e., greater than 45° off axis.

Figure 8:
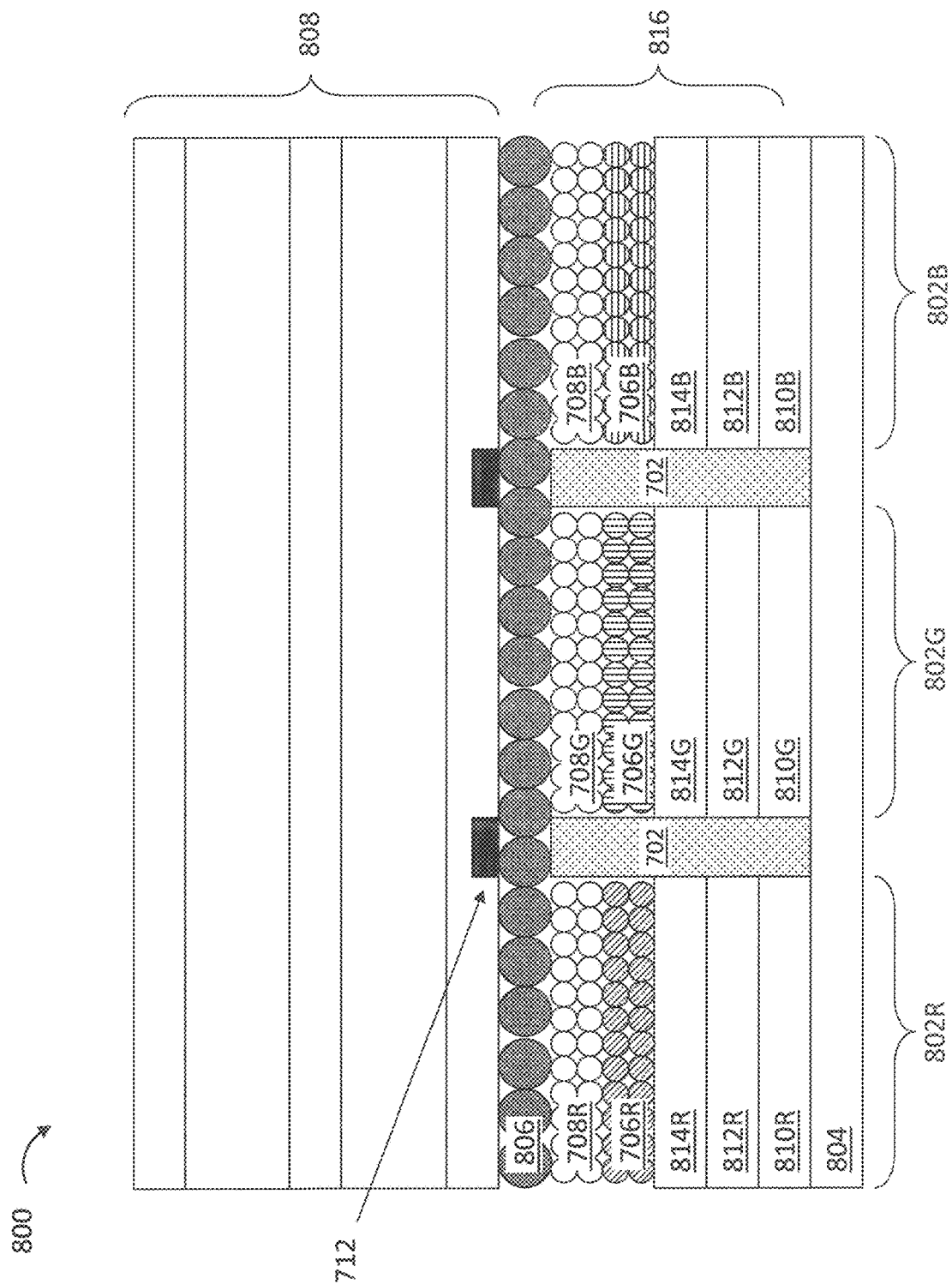
FIG. 8 is a schematic drawing depicting a pixel structure with a conductive grid coupled to a nanoparticle electrode in accordance with embodiments of the present invention.

FIG. 8 is a schematic drawing depicting a pixel structure with a conductive grid coupled to a nanoparticle electrode in accordance with embodiments of the present invention. Pixel structure 800 includes a red sub-pixel 802R, a green sub-pixel 802G, and a blue sub-pixel 802B. Again, more generally with reference to the various layers in the figure, "R" denotes the red sub-pixel, "G" denotes the green sub-pixel, and "B" denotes the blue sub-pixel. The pixel structure 800 includes a substrate 804, a nanoparticle electrode layer 806 common for all the sub-pixels, and a thin-film encapsulation layer 808 common for all the sub-pixels 802 in the pixel structure 800. The red sub-pixel 802R includes a reflector 810R formed on the substrate 804, a bottom electrode 812R, a first CTL 814R, a red EML 706R, and a second CTL 708R. The green sub-pixel 802G includes a reflector 810G formed on the substrate 804, a bottom electrode 812G, a first CTL 814G, a green EML 706G, and a second CTL 708G. The blue sub-pixel 802B includes a reflector 810B formed on the substrate 804, a bottom electrode 812B, a first CTL 814B, a blue EML 706B, and a second CTL 708B. While the second CTLs 708R, 708G, 708B are presented as separated by banks 702 in this example, it should be understood that this layer could be a shared charge transport layer deposited on top of the banks 702 as in FIG. 7.

As shown in FIG. 8, the conductive grid 712 is disposed horizontally between the emissive layers 706 of adjacent sub-pixels 802 and vertically in line with the one or more bank structures 702 that separate adjacent sub-pixels 802. The conductive grid 712 is in electrical contact with the nanoparticle electrode layer 806. The conductive grid 712 is disposed between the nanoparticle electrode layer 806 and the thin film encapsulation layers 808 and may be in physical contact with the nanoparticle electrode layer 806. In alternative embodiments, the conductive grid 712 may be disposed between the nanoparticle electrode layer 806 and the one or more bank structures 702, or disposed within the same layer between portions of the nanoparticle electrode layer 806 by depositing the nanoparticle electrode layer 806 in two or more steps.

The nanoparticle electrode layer 806, the second CTLs 708, and/or the thin film encapsulation layers 808 may be characterized by substantially similar, or the same, refractive indices. The term "substantially similar" with respect to the refractive indices denotes that a negligible amount of reflection occurs at the layer interfaces. For example, a refractive index difference of 0.25 between adjacent layers results in a reflectivity at normal incidence of approximately 0.5%, while a refractive index difference of 0.1 between adjacent layers results in a reflectivity at normal incidence of approximately 0.1%. Because the layers have substantially similar refractive indices, the layers in pixel structure 800 are characterized by high transmission efficiency and low reflection. The high transmission and low reflection of the layers results in only a small proportion of the light emitted by the EML 706 being reflected from the nanoparticle electrode layer 806 back toward the EML 706. As a result of the improved transmission efficiency, reliance on an optical cavity 816 formed by the nanoparticle electrode layer 806 and the reflector 810 to enhance the light emitted from the sub-pixels is reduced in comparison to conventional techniques. Because the requirement to enhance the light by using an optical cavity is reduced, the required strength of the optical cavity 816 formed between the nanoparticle electrode layer 806 and the reflectors 810 under the bottom electrodes 812 is reduced. Accordingly, reliance on the optical cavity 816 to improve the efficiency of the device reduced. Therefore, the tolerance for dimensions of the optical cavity 816 in pixel structure 800 may be increased to simplify the manufacturing process.

FIG. 9 is a plan view depicting how blocks of three quantum dot LEDs with the conductive grid shown in FIG. 8 are tiled to make a display device 900 in accordance with embodiments of the present invention. As shown, the conductive grid 712 is a single connected layer disposed over the one or more bank structures 702 of each block 902 of QLEDs. The conductive grid 712 of each block is electrically connected as denoted by element 904 to cover the whole area of a display device 900, and further contacts an electrode connection 906. One or more electrode connections 906 provide charges to the blocks 902 of QLEDs and are located at the edge of the display device 900. The location of the conductive grid 712 above the bank 702 minimizes the occlusion of off-axis light emitted by the quantum dot LEDs, which improves the optical properties of the display device 900.

The specific material examples described above provide a particular arrangement and specific methods of fabricating a QLED with a nanoparticle electrode layer according to an embodiment of the present invention. Other sequences of layers and/or steps may also be performed according to alternative embodiments, and may be adapted to form any suitable structure of light-emitting device including a standard structure, inverted structure, top emitting structure, and/or bottom emitting structure as may be suitable for any particular application.

An aspect of the invention, therefore, is a light-emitting device that incorporates an electrode that includes conductive nanoparticles to increase emission performance. In exemplary embodiments, a light-emitting device includes a substrate; a first electrode disposed on the substrate between a viewing side of the light-emitting device and the substrate; a second electrode disposed between the first electrode and the viewing side of the light-emitting device, wherein the second electrode includes a layer of nanoparticles that are electrically conductive; and an emissive layer in electrical contact with the first electrode and the second electrode comprising nanoparticles, wherein the emissive layer includes a material that emits light when electrically excited. The light-emitting device may include one or more of the following features, either individually or in combination.

In an exemplary embodiment of the light-emitting device, the light-emitting device further includes a first charge transport layer disposed between the first electrode and the emissive layer; and a second charge transport layer disposed between the emissive layer and the second electrode.

In an exemplary embodiment of the light-emitting device, the light-emitting device further includes a thin film encapsulation layer disposed between the second electrode and the viewing side of the light-emitting device.

In an exemplary embodiment of the light-emitting device, at least one or more of the layer of nanoparticles, the second charge transport layer, and the emissive layer have refractive indices which differ by no more than 0.25 at the wavelength of light emitted by the light-emitting device.

In an exemplary embodiment of the light-emitting device, the layer of nanoparticles in the second electrode have a first diameter greater than a second diameter of particles in the second charge transport layer.

In an exemplary embodiment of the light-emitting device, the layer of nanoparticles in the second electrode are nanorods that have a major axis aligned substantially parallel to a plane formed by the second electrode, and a minor axis substantially perpendicular to the plane formed by the second electrode.

In an exemplary embodiment of the light-emitting device, the layer of nanoparticles in the second electrode are nanoplatelets having two orthogonal major axes aligned substantially parallel to a plane formed by the second electrode, and a minor axis substantially perpendicular to the plane formed by the second electrode.

In an exemplary embodiment of the light-emitting device, the light-emitting device further includes an electrode connection electrically coupled to the second electrode.

In an exemplary embodiment of the light-emitting device, the light-emitting device further includes a bank structure formed on the substrate, wherein the bank structure separates the light-emitting device into at least a first sub-pixel and a second sub-pixel, wherein the first sub-pixel emits light with a first wavelength and includes a first portion of the first electrode and a first portion of the emissive layer in electrical contact with the first portion of the first electrode and the second electrode, wherein the second sub-pixel emits light with a second wavelength different from the first wavelength, and includes a second portion of the first electrode and a second portion of the emissive layer in electrical contact with the second portion of the first electrode and the second electrode, and wherein the first portion of the first electrode and the first portion of the emissive layer are separated from the second portion of the first electrode and the second portion of the emissive layer by the bank structure.

In an exemplary embodiment of the light-emitting device, the light-emitting device further includes a conductive grid disposed vertically over the bank structure and electrically connected to the second electrode.

In an exemplary embodiment of the light-emitting device, the light-emitting device further includes an electrode connection electrically coupled to the conductive grid.

In an exemplary embodiment of the light-emitting device, the light-emitting device further includes a first charge transport layer disposed between the first electrode and the emissive layer; and a second charge transport layer disposed between the emissive layer and the second electrode; wherein thicknesses of the charge transport layers are the same for the sub-pixels.

In an exemplary embodiment of the light-emitting device, the emissive layer portions of the different sub-pixels have different thicknesses.

In an exemplary embodiment of the light-emitting device, the light-emitting device further includes a third sub-pixel, wherein the third sub-pixel emits light with a third wavelength different from the first and second wavelengths, and includes a third portion of the first electrode and a third portion of the emissive layer in electrical contact with the third portion of the first electrode and the second electrode, and wherein the third portion of the first electrode and the third portion of the emissive layer are separated from the first and second portions of the first electrode and the first and second portions of the emissive layer by the bank structure.

In an exemplary embodiment of the light-emitting device, the first, second, and third sub-pixels correspond to red, green, and blue sub-pixels.

In an exemplary embodiment of the light-emitting device, the second charge transport layer and the nanoparticle layer in the second electrode comprise the same material.

In an exemplary embodiment of the light-emitting device, the layer of nanoparticles in the second electrode is semi-transparent to light in a wavelength range 400 nm≤λ≤700 nm.

In an exemplary embodiment of the light-emitting device, the layer of nanoparticles in the second electrode has a transmission that is at least 70% for light in the wavelength range 400 nm A 700 nm.

In an exemplary embodiment of the light-emitting device, the layer of nanoparticles includes at least one of indium tin oxide (ITO), indium zinc oxide (IZO), indium gallium zinc oxide (IGZO), zinc oxide (ZnO), aluminum zinc oxide (AZO) and titanium dioxide ($TiO_2$).

In an exemplary embodiment of the light-emitting device, the emissive layer includes one of light-emitting organic materials or quantum dot nanoparticles.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention relate to configurations of display devices. The display devices may include, but are not limited to, mobile phones, smartphones, personal digital assistants (PDAs), tablet and laptop computers, and televisions and monitors.

REFERENCE SIGNS LIST

100—LED structure
101—substrate
102—reflector
103—anode
104—cathode
105—emissive layer (EML)
106—anode side charge transport layer (CTL)
107—CTL cathode side
108—top surface
109—bottom surface
110—encapsulation layer
111a/b/c—inorganic layer
112 a/b/c—polymer layer
200/200a/200b—pixel structure
202—bank structure
300—display device
301—coupling directions
302—electrical connection
400—quantum dot LED
404—top electrode
405—emissive layer (EML)
406—hole transport layer (HTL)
407—electron transport layer (ETL)
408—nanoparticles
409—top electrode thickness
410—nanoparticles
411—nanoparticles
500—LED structure
504—top electrode
508—nanoparticles
512—smaller diameter nanoparticles
513—larger diameter nanoparticles
600—LED structure
604—top electrode
608—nanoparticles
614—major axis
615—minor axis
700—sub-pixel structure
702—bank structure
704—first CTL
706—EML
708—second CTL
710—nanoparticle top electrode
712—conductive grid
714—width
716—vertical displacement
800—pixel structure
802—sub-pixels
804—substrate
806—nanoparticle electrode layer
808—thin-film encapsulation
810—reflector
812—bottom electrodes
814—first CTL
816—optical cavity
900—display device
902—block
904—element
906—electrode connection
R/G/B—red, green, or blue

What is claimed is:

1. A light-emitting device comprising:
   a substrate;
   a first electrode disposed on the substrate between a viewing side of the light-emitting device and the substrate;
   a second electrode disposed between the first electrode and the viewing side of the light-emitting device, wherein the second electrode includes a layer of nanoparticles that are electrically conductive;
   an emissive layer in electrical contact with the first electrode and the second electrode comprising nanoparticles, wherein the emissive layer includes a material that emits light when electrically excited;
   a first charge transport layer disposed between the first electrode and the emissive layer; and
   a second charge transport layer disposed between the emissive layer and the second electrode;
   wherein the layer of nanoparticles in the second electrode have a first diameter greater than a second diameter of particles in the second charge transport layer.

2. The light-emitting device of claim 1 further comprising a thin film encapsulation layer disposed between the second electrode and the viewing side of the light-emitting device.

3. The light-emitting device of claim 1 wherein at least one or more of the layer of nanoparticles, the second charge transport layer, and the emissive layer have refractive indices which differ by no more than 0.25 at the wavelength of light emitted by the light-emitting device.

4. The light-emitting device of claim 1 wherein the layer of nanoparticles in the second electrode are nanorods that have a major axis aligned substantially parallel to a plane formed by the second electrode, and a minor axis substantially perpendicular to the plane formed by the second electrode.

5. The light-emitting device of claim 1 wherein the layer of nanoparticles in the second electrode are nanoplatelets having two orthogonal major axes aligned substantially parallel to a plane formed by the second electrode, and a minor axis substantially perpendicular to the plane formed by the second electrode.

6. The light-emitting device of claim 1 further comprising an electrode connection electrically coupled to the second electrode.

7. The light-emitting device of claim 1 further comprising:
   a bank structure formed on the substrate, wherein the bank structure separates the light-emitting device into at least a first sub-pixel and a second sub-pixel,
   wherein the first sub-pixel emits light with a first wavelength and includes a first portion of the first electrode and a first portion of the emissive layer in electrical contact with the first portion of the first electrode and the second electrode,
   wherein the second sub-pixel emits light with a second wavelength different from the first wavelength, and includes a second portion of the first electrode and a second portion of the emissive layer in electrical contact with the second portion of the first electrode and the second electrode, and
   wherein the first portion of the first electrode and the first portion of the emissive layer are separated from the second portion of the first electrode and the second portion of the emissive layer by the bank structure.

8. The light-emitting device of claim 7 further comprising a conductive grid disposed vertically over the bank structure and electrically connected to the second electrode.

9. The light-emitting device of claim 8 further comprising an electrode connection electrically coupled to the conductive grid.

10. The light-emitting device of claim 7 wherein thicknesses of the charge transport layers are the same for the sub-pixels.

11. The light-emitting device of claim 7, wherein the emissive layer portions of the different sub-pixels have different thicknesses.

12. The light-emitting device of claim 7 further comprising:
   a third sub-pixel, wherein the third sub-pixel emits light with a third wavelength different from the first and second wavelengths, and includes a third portion of the first electrode and a third portion of the emissive layer in electrical contact with the third portion of the first electrode and the second electrode, and
   wherein the third portion of the first electrode and the third portion of the emissive layer are separated from the first and second portions of the first electrode and the first and second portions of the emissive layer by the bank structure.

13. The light-emitting device of claim 12, wherein the first, second, and third sub-pixels correspond to red, green, and blue sub-pixels.

14. The light-emitting device of claim 1 wherein the second charge transport layer and the nanoparticle layer in the second electrode comprise the same material.

15. The light-emitting device of claim 1 wherein the layer of nanoparticles in the second electrode is semi-transparent to light in a wavelength range 400 nm$\leq\lambda\leq$700 nm.

16. The light-emitting device of claim 1 wherein the layer of nanoparticles in the second electrode has a transmission that is at least 70% for light in the wavelength range 400 nm$\leq\lambda\leq$700 nm.

17. The light-emitting device of claim 1 wherein the layer of nanoparticles includes at least one of indium tin oxide (ITO), indium zinc oxide (IZO), indium gallium zinc oxide (IGZO), zinc oxide (ZnO), aluminum zinc oxide (AZO) and titanium dioxide (TiO2).

18. The light-emitting device of claim 1 wherein the emissive layer includes one of light-emitting organic materials or quantum dot nanoparticles.

* * * * *